(12) United States Patent
Han

(10) Patent No.: US 8,421,708 B2
(45) Date of Patent: Apr. 16, 2013

(54) IMAGE DISPLAY AND ORGANIC LIGHT-EMITTING DISPLAY INCLUDING IMAGE SHIFT UNIT

(75) Inventor: Dong-Won Han, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 287 days.

(21) Appl. No.: 13/043,379

(22) Filed: Mar. 8, 2011

(65) Prior Publication Data

US 2011/0310128 A1    Dec. 22, 2011

(30) Foreign Application Priority Data

Jun. 16, 2010    (KR) .................. 10-2010-0057114

(51) Int. Cl.
*G09G 5/00*    (2006.01)
(52) U.S. Cl.
USPC .......................................... 345/1.3; 345/672
(58) Field of Classification Search ............... 345/1.1–6, 345/672; 313/1
See application file for complete search history.

(56) References Cited

U.S. PATENT DOCUMENTS

| | | |
|---|---|---|
| 2008/0224949 A1 | 9/2008 | Lee et al. |
| 2010/0026707 A1 | 2/2010 | Hoogenstraaten et al. |
| 2010/0053229 A1 | 3/2010 | Krijn et al. |
| 2010/0091193 A1 | 4/2010 | Hoogenstraaten et al. |

FOREIGN PATENT DOCUMENTS

| | | |
|---|---|---|
| KR | 1998-0007768 A | 3/1998 |
| KR | 10-2004-0005031 A | 1/2004 |
| KR | 10-2008-0078263 A | 8/2008 |
| WO | WO 2006/003604 A1 | 1/2006 |

OTHER PUBLICATIONS

Extended European Search Report dated Jan. 3, 2013 for European Patent Application No. EP 11 168 253.0 which shares priority of Korean Patent Application No. KR 10-2010-0057114 with captioned U.S. Appl. No. 13/043,379.

*Primary Examiner* — Anh Mai
*Assistant Examiner* — Elmito Breval
(74) *Attorney, Agent, or Firm* — Knobbe, Martens, Olson & Bear LLP

(57) ABSTRACT

An image display is disclosed. In one embodiment, the display includes a first display panel comprising i) a first image display portion configured to display a first image and ii) a light transmissive portion formed outside the first image display portion and configured to display a second image. The display further includes i) a second display panel spaced apart from the first display panel and configured to generate the second image and ii) an image shift unit configured to shift the generated second image toward the light transmissive portion of the first display panel so that the shifted second image is projected through the light transmissive portion.

21 Claims, 3 Drawing Sheets

IMAGE DISPLAY AND ORGANIC LIGHT-EMITTING DISPLAY INCLUDING IMAGE SHIFT UNIT

CROSS-REFERENCE TO RELATED PATENT APPLICATION

This application claims the benefit of Korean Patent Application No. 10-2010-0057114, filed on Jun. 16, 2010, in the Korean Intellectual Property Office, the disclosure of which is incorporated herein in its entirety by reference.

BACKGROUND

1. Field

The described technology generally relates to an image display and an organic-light emitting display including an image shift unit.

2. Description of the Related Technology

An image display such as an organic light-emitting display generally includes a dead space (i.e., a non-emissive portion) around an emissive portion on which an image is displayed. In order to minimize the size of the image display and to maximize the size of a display portion, the dead space needs to be minimized.

SUMMARY

One inventive aspect is an image display and an organic-light emitting display wherein a dead space (i.e., a non-emissive portion) is removed so that image quality is improved.

Another aspect is an image display which includes a first display panel including a first image display portion for displaying a first image, and a second image display portion that is disposed outside of the first image display portion and displays a second image; a second display panel that is vertically spaced apart from the first display panel and displays the second image; and an image shift unit for shifting the second image displayed on the second display panel to the second image display portion of the first display panel.

The first image display portion may include a first image light-emitting portion for emitting the first image, and the second display panel may include a second image emitting portion for emitting the second image.

The second image display portion may be disposed on a non-emissive portion of the first display panel.

The second image display portion may be transparent as long as the second image is not shifted from the second display panel.

The image shift unit may shift the second image displayed on the second display panel to the second image display portion according to a one to one correspondence.

The image shift unit may be disposed between the first display panel and the second display panel.

The image shift unit may include a first reflective surface for reflecting the second image emitted from the second display panel; and a second reflective surface that is disposed parallel to the first reflective surface, and reflects the second image reflected on the first reflective surface to the second image display portion.

The first reflective surface and the second reflective surface may be respectively disposed on surfaces of a prim.

The second display panel may be disposed between the first display panel and the image shift unit.

The image shift unit may include a first reflective surface for reflecting the second image emitted from the second display pane; and a second reflective surface that is disposed to be symmetrical with the first reflective surface, and reflects the second image reflected on the first reflective surface to the second image display portion.

The first reflective surface and the second reflective surface may be respectively disposed on a first reflective mirror and a second reflective mirror that are spaced apart from each other.

The second image display portion may be disposed so as to directly contact an outside area of the first image display portion.

The second image displayed on the second image display portion may be consecutively displayed together with an image displayed on the first image display portion.

The first display panel may be a flat display.

Another aspect is an organic light-emitting display including a first organic light-emitting display panel including: a first image display portion that is disposed on a substrate, includes a first organic light-emitting portion, and displays a first image emitted from the first organic light-emitting portion; a second image displaying portion that is disposed outside of the first image displaying portion and displays a second image; and a sealing member of a thin film that is stacked on the first image displaying portion and the second image displaying portion; a second organic light-emitting display panel that is vertically spaced apart from the first display panel, and includes a second organic light-emitting portion for emitting the second image; and an image shift unit for shifting the second image emitted from the second organic light-emitting portion to the second image displaying portion of the first organic light-emitting display panel.

The sealing member may be configured by alternately stacking an organic layer and an inorganic layer.

The sealing member may be transparent.

The first organic light-emitting display panel may include a first image driver for applying an image signal to the first organic light-emitting portion.

The second organic light-emitting display panel may include a second image driver for applying an image signal to the second organic light-emitting portion.

The image shift unit may shift the second image displayed on the second organic light-emitting display panel to the second image display portion according to one-to-one correspondence.

The image shift unit may be disposed between the first organic light-emitting display panel and the second organic light-emitting display panel.

The second organic light-emitting display panel may be disposed between the first organic light-emitting display panel and the image shift unit.

Another aspect is an image display comprising: a first display panel comprising i) a first image display portion configured to display a first image and ii) a light transmissive portion formed outside the first image display portion and configured to display a second image; a second display panel spaced apart from the first display panel and configured to generate the second image; and an image shift unit configured to shift the generated second image toward the light transmissive portion of the first display panel so that the shifted second image is projected through the light transmissive portion.

In the above display, the first image display portion comprises a first image light-emitting portion configured to emit the first image, and wherein the second display panel comprises a second image emitting portion configured to emit the second image.

In the above display, the light transmissive portion is formed on a non-emissive portion of the first display panel. In the above display, the first image display portion includes a self-emissive light emitting layer, and wherein the light transmissive portion does not include a self-emissive light emitting layer.

In the above display, the image shift unit is further configured to shift the generated second image toward the light transmissive portion according to a one to one image correspondence. In the above display, the image shift unit is formed between the first display panel and the second display panel. In the above display, the image shift unit comprises: a first reflective portion configured to first reflect the generated second image; and a second reflective portion formed substantially parallel to the first reflective portion, and configured to reflect the first reflected second image toward the light transmissive portion.

In the above display, the first and second reflective portions are respectively formed on opposing surfaces of a prism. In the above display, the second display panel is formed between the first display panel and the image shift unit. In the above display, the image shift unit comprises: a first reflective portion configured to first reflect the generated second image; and a second reflective portion formed to be substantially symmetrical with the first reflective portion, and configured to reflect the first reflected second image toward the light transmissive portion.

In the above display, the first and second reflective portions are respectively formed on a first reflective mirror and a second reflective mirror that are spaced apart from each other. In the above display, the light transmissive portion abuts the first image display portion. In the above display, the light transmissive portion is configured to transmit the second image substantially consecutively to the first image displayed on the first image display portion. In the above display, the second display panel is substantially vertically arranged with respect to the first display panel.

Another aspect is an organic light-emitting display comprising: a first organic light-emitting display panel comprising: i) a first image display portion disposed on a substrate and configured to display a first image emitted from a first organic light-emitting portion, ii) a light transmissive portion substantially surrounding the first image display portion and configured to display a second image and iii) a sealing member formed on the first image display portion and the light transmissive portion; a second organic light-emitting display panel that is spaced apart from the first display panel, and comprises a second organic light-emitting portion configured to emit the second image; and an image transfer unit configured to transfer the emitted second image toward the light transmissive portion of the first organic light-emitting display panel so that the transferred second image is projected through the light transmissive portion.

In the above display, the sealing member comprises at least one organic layer and at least one inorganic layer which are alternately formed. In the above display, the sealing member is transparent. In the above display, the first image display portion of the first organic light-emitting display panel comprises a first image driver configured to apply an image signal to the first organic light-emitting portion, wherein the light transmissive portion of the first organic light-emitting display panel does not comprise an image driver, and wherein the second organic light-emitting display panel comprises a second image driver configured to apply an image signal to the second organic light-emitting portion.

In the above display, the second organic light-emitting display panel is substantially vertically arranged with respect to the first organic light-emitting display panel. In the above display, the image transfer unit is further configured to transfer the emitted second image toward the light transmissive portion according to one-to-one image correspondence. In the above display, the image transfer unit is formed between the first organic light-emitting display panel and the second organic light-emitting display panel. In the above display, the second organic light-emitting display panel is formed between the first organic light-emitting display panel and the image transfer unit. Another aspect is an organic light-emitting display comprising: a first organic light-emitting display panel comprising: i) a self-emissive region and ii) a non-self-emissive region; a second organic light-emitting display panel spaced apart from the first display panel and configured to emit an image; and an image transfer unit configured to transfer the emitted image toward the non-light emitting region of the first organic light-emitting display panel so that the transferred image is projected through the non-self-emissive region.

DETAILED DESCRIPTION

Embodiments will now be described more fully with reference to the accompanying drawings.

Figure 1:
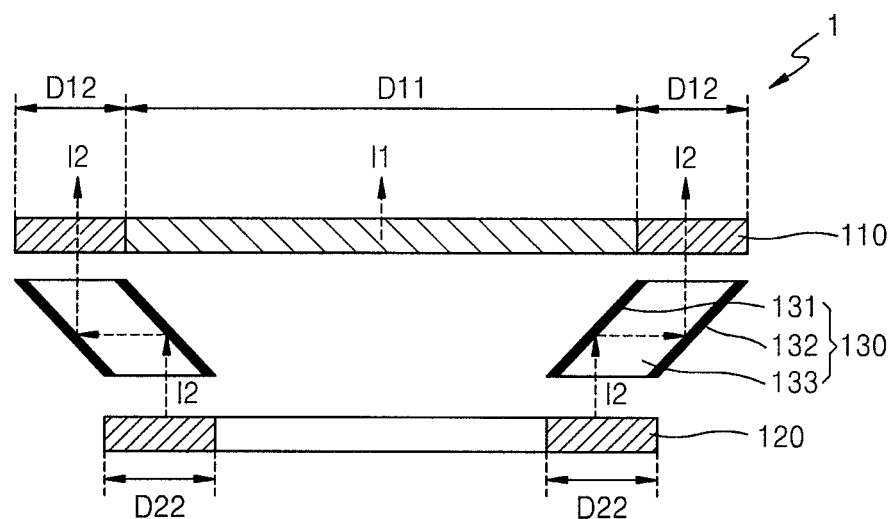
FIG. 1 is a cross-sectional view of an image display according to an embodiment.

FIG. 1 is a cross-sectional view of an image display 1 according to an embodiment.

Referring to FIG. 1, the image display 1 includes a first display panel 110, a second display panel 120, and an image shift unit (or image transfer unit) 130 disposed between the first display panel 110 and the second display panel 120.

The first display panel 110 includes a first image display portion D11 displaying a first image I1, and a second image display portion D12 (or a light transmissive portion) disposed outside of or substantially surrounding the first image display portion D11 and displaying a second image I2.

In one embodiment, as shown in FIG. 1, the second image display portion D12 is disposed on four edge portions of the first image display portion D11. The second image display portion D12 may be disposed on at least one edge portion of the first image display portion D11.

Although not illustrated in FIG. 1 in detail, the first image display portion D11 includes a first image emitting portion (not shown) for emitting the first image I1. For example, the first image emitting portion may include a plurality of light-emitting diodes including an organic self-emissive light-emitting material. Various colors may be realized by a combination of, for example, red, green and blue light-emitting diodes. Of course, the first image display portion D11 may further include a driver (not shown) for driving the first image emitting portion.

On the other hand, the second image display portion D12 may be disposed outside of the first image display portion D11 so as to directly contact the first image display portion D11. In one embodiment, the second image display portion D12 does not include a separate image emitting portion, and thus does not include a driver for driving the light emitting portion.

Thus, while the second image I2 emitted from a second image display portion D22 of the second display panel 120 is not shifted or transferred to the first display panel 110, which will be described later, the second image display portion D12 of the first display panel 110 is maintained as a dead space, that is, a non-emissive portion, of the first display panel 110.

In one embodiment, the second image display portion D12 of the first display panel 110 displays the second image I2 emitted from the second display panel 120 without any change in brightness and color. Thus, generally, the more transparent the second image display portion D12, the better the image display 1 is. In this embodiment, since the second image display portion D12 does not include a separate image emitting portion and driver, the second image display portion D12 may be maintained transparent as long as the second image I2 is not displayed on the second image display portion D12.

Figure 2:
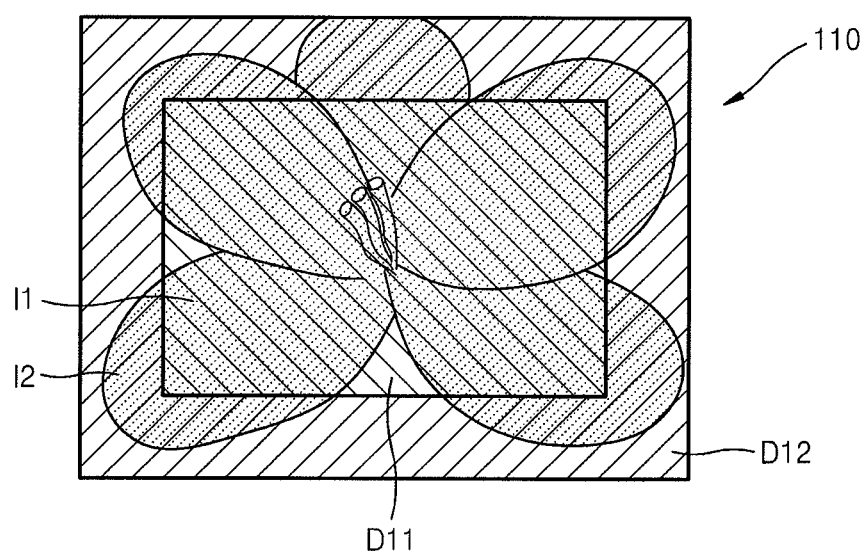
FIG. 2 is a plan view showing a first image and a second image displayed on a first display panel of the image display of FIG. 1, according to an embodiment.

In one embodiment, as shown in FIG. 2, the second display panel 120 is substantially vertically spaced apart from the first display panel 110, and is disposed inside of the image display 1. In another embodiment, the second display panel 120 is not vertically spaced apart from the first display panel 110, while the image shift unit 130 shifts or transfers the emitted second image I2 to the second image display portion D12 of the first display panel 110, such that the second image I2 is displayed through the second image display portion D12 This applies to the other disclosed embodiments.

The second display panel 120 includes the second image display portion D22 for displaying the second image I2.

Although not illustrated in FIG. 1, the second image display portion D22 of the second display panel 120 includes a second image emitting portion (not shown) for emitting the second image I2. For example, the second image emitting portion may include a plurality of light-emitting diodes, like the first image emitting portion. Of course, the second image display portion D22 may include a driver (not shown) for driving the second image emitting portion.

The image shift unit 130 is disposed between the first display panel 110 and the second display panel 120. The image shift unit 130 shifts or transfers the second image I2 displayed on the second display panel 120 to the second image display portion D12 of the first display panel 110 according to a one-to-one correspondence.

The image shift unit 130 includes a first reflective surface 131 that reflects the second image I2 emitted from the second image emitting portion (not shown) of the second display panel 120, and a second reflective surface 132 that is disposed substantially parallel to the first reflective surface 131, and reflects the second image I2 reflected on the first reflective surface 131 to the second image display portion D12 of the first display panel 110.

For example, the first reflective surface 131 and the second reflective surface 132 may be respectively disposed on surfaces of a substantially triangular prism. According to the present embodiment, the first reflective surface 131 and the second reflective surface 132 may be respectively disposed on surfaces of a single prism 133 having a substantially parallelogram shape. Alternatively, the first reflective surface 131 and the second reflective surface 132 may be respectively disposed on surfaces of a reflective mirror (not shown) instead of a prism.

According to the present embodiment, the first reflective surface 131 and the second reflective surface 132 are inclined at an inclination angle of about 45 degrees with respect to display surfaces of the first display panel 110 and the second display panel 120, but the present embodiment is not limited thereto. That is, by controlling the inclination angle of the first reflective surface 131 and the second reflective surface 132, a distance between the first display panel 110 and the second display panel 120 may be controlled.

FIG. 2 is a plan view showing the first image I1 and the second image I2 displayed on the first display panel 110 of the image display 1 of FIG. 1, according to an embodiment.

In the image display 1, the first image I1 emitted from the first image emitting portion (not shown) of the first display panel 110 is displayed on the first image display portion D11. The second image I2 emitted from the second image emitting portion (not shown) of the second display panel 120, which is substantially vertically spaced apart from the first display panel 110, is shifted by the image shift unit 130 disposed between the first display panel 110 and the second display panel 120, and then is displayed on the second image display portion D12 of the first display panel 110. Thus, the second image I2 is displayed on the second image display portion D12 of the first display panel 110, which is a dead space (i.e., a non-emissive portion), thereby removing the dead space.

The second image I2 is displayed as a boundary image of the first image I1, which is consecutively displayed on the first image I1.

In some image displays, since the resolution of an image file does not correspond to the resolution of an image display, the entire image of the image file may not be displayed, and the image may appear to have been cropped. In this case, the cropped image is displayed as the second image I2 on the second display panel 120, and then is shifted to the second image display portion D12 of the first display panel 110 by the image shift unit 130 so as to be displayed as a boundary image that is consecutively displayed on the first image I1. Thus, the entire image may be displayed without cropping, and may be displayed on a large-sized screen without any the dead place.

Hereinafter, an image display 2 according to another embodiment will be described with reference to FIG. 3. The image display 2 will be described in terms of differences from the image display 1 of FIG. 1, and like reference numerals may denote like elements in different drawings.

Figure 3:
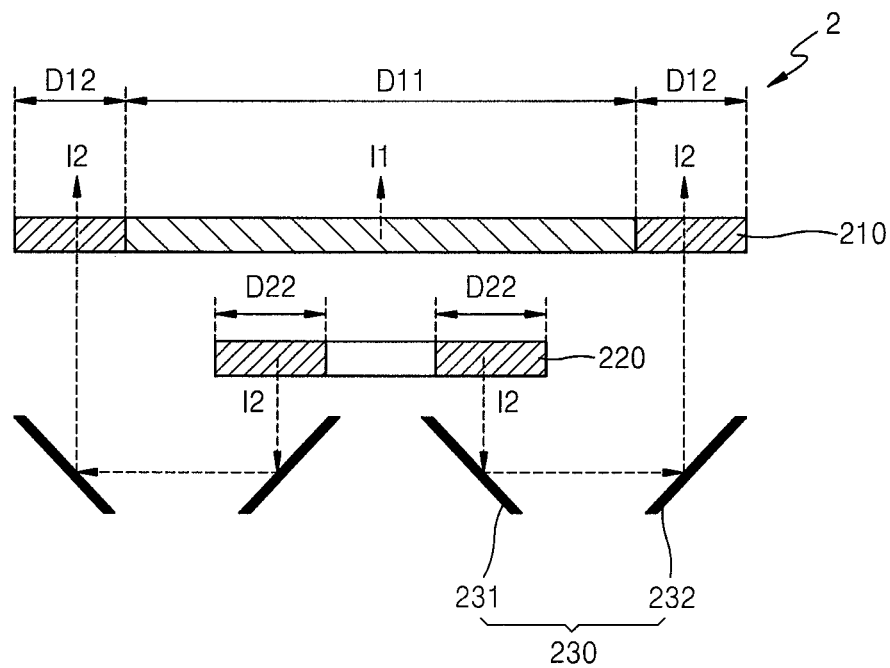
FIG. 3 is a cross-sectional view of an image display according to another embodiment.

Referring to FIG. 3, the image display 2 includes a first display panel 210, a second display panel 220, and an image shift unit 230 disposed on rear surfaces of the first display panel 210 and the second display panel 220.

The first display panel 210 includes the first image display portion D11 for displaying the first image I1, and the second image display portion D12 that is disposed outside of the first image display portion D11 and displays the second image I2.

The second display panel 220 is substantially vertically spaced apart from the first display panel 210, and is disposed inside the image display 1. The second display panel 220 includes the second image display portion D22 for displaying the second image I2.

Like in FIGS. 1 and 2, the first image display portion D11 of the first display panel 210 includes a first image emitting portion (not shown) for emitting the first image I1, but the second image display portion D12 of the first display panel 210 does not include a separate image emitting portion. Thus, while the second image I2 emitted from the second image display portion D22 of the second display panel 220 is not shifted to the first display panel 210, the second image display portion D12 of the first display panel 210 is maintained as a dead space, i.e., a non-emissive portion, of the first display panel 210. However, since the second image display portion D12 does not include separate image emitting portion and driver, the second image display portion D12 may be maintained to be transparent while the second image I2 is not displayed on the second image display portion D12.

The image shift unit 230 is disposed on rear surfaces of the first display panel 210 and the second display panel 220. In FIG. 1, the second display panel 120 is disposed so that a display surface of the second display panel 120, on which the second image I2 is displayed, may face the first display panel 110. On the other hand, in FIG. 3, the second display panel 220 is disposed so that a display surface of the second display panel 220 on which the second image I2 is displayed may face an opposite side of the first display panel 210.

Thus, since the image shift unit 230 is disposed on the rear surface of the second display panel 220, the image shift unit 230 may shift the second image I2 emitted from the second display panel 220 to the second image display portion D12 of the first display panel 210 according to a one to one correspondence by reflecting the second image I2.

The image shift unit 230 includes a first reflective surface 231 for reflecting the second image I2 emitted from the second image emitting portion (not shown) of the second display panel 220, and a second reflective surface 232 that is disposed to be substantially symmetric with the first reflective surface 231, and reflects the second image I2 reflected on the first reflective surface 231 to the second image display portion D12 of the first display panel 210.

The first reflective surface 231 and the second reflective surface 232 may be respectively disposed on surfaces of a substantially triangular prism, or alternatively, may be respectively disposed on surfaces of a reflective mirror (not shown) without a prism.

Hereinafter, an image display 3 according to another embodiment will be described with reference to FIGS. 4 and 5. The image display 3 will be described in terms of differences from the image displays 1 and 2, and like reference numerals may denote like elements in different drawings.

Figure 4:
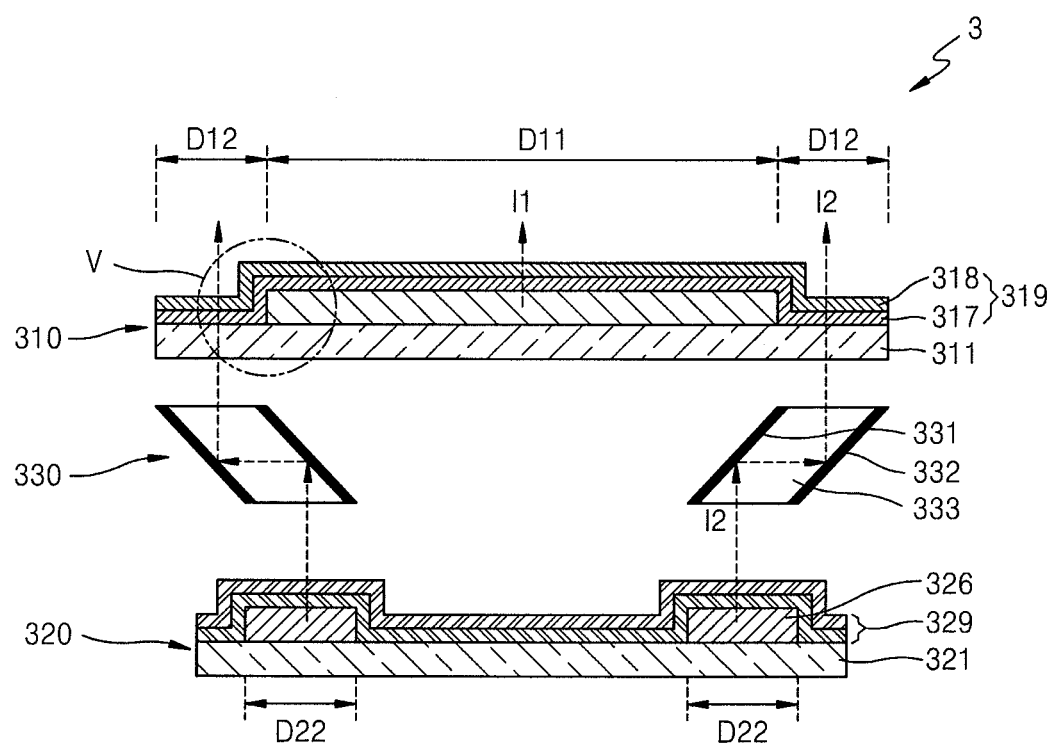
FIG. 4 is a cross-sectional view of an image display according to another embodiment.

FIG. 4 is a cross-sectional view of an image display 3 according to another embodiment. FIG. 5 is an enlarged cross-sectional view of a portion 'V' of FIG. 4.

Figure 5:
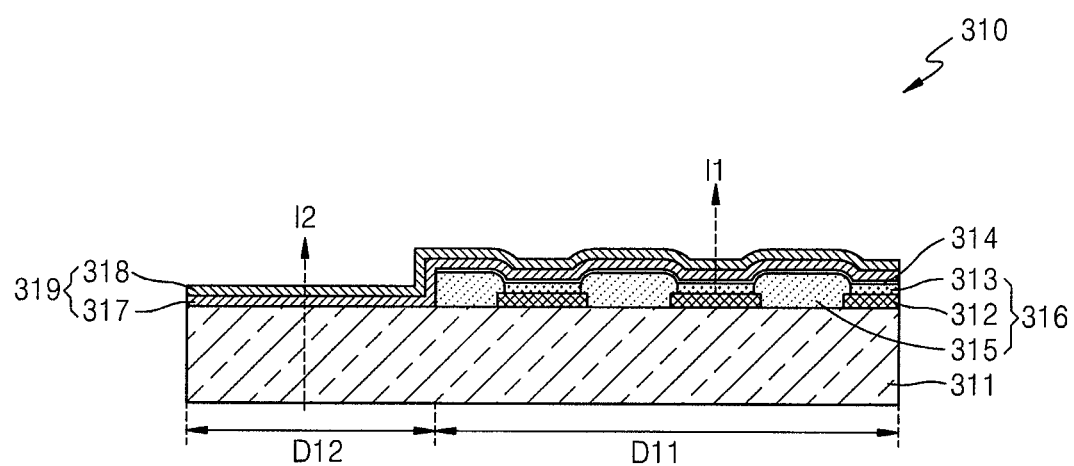
FIG. 5 is an enlarged cross-sectional view of a portion 'V' of FIG. 4.

Referring to FIGS. 4 and 5, the image display 3 includes a first display panel 310, a second display panel 320, and an image shift unit 330 disposed between the first display panel 210 and the second display panel 220.

The first display panel 310 includes the first image display portion D11 that is disposed on a substrate 311 and displays the first image I1, the second image display portion D12 that is disposed outside the first image display portion D11 and displays the second image I2, and a sealing member 319 including a plurality of thin films that are stacked on the first image display portion D11 and the second image display portion D12.

Since the second image I2 emitted from the second display panel 320 is shifted to the second image display portion D12 of the first display panel 310 through the substrate 311, the substrate 311 may be formed of a transparent material.

The first image I1 is emitted from a first organic light-emitting portion 316 of the first display panel 310.

The first organic light-emitting portion 316 includes an organic light-emitting layer 313 interposed between a first electrode 312 and a second electrode 314. When the first electrode 312 and the second electrode 314 function as an anode or a cathode by applying a voltage to the first electrode 312 and the second electrode 314, electrons and holes injected from the first electrode 312 and the second electrode 314 are combined with the organic light-emitting layer 313 to form excitons, and the organic light-emitting layer 313 emits light by the excitons to realize the first image I1. Thus, the image display 3 may have high resolution, high image quality, low power consumption, and long lifetime.

Since the image display 3 is a top emission type that displays an image towards the sealing member 319, the first electrode 312 may function as a reflective electrode, and the second electrode 314 may function as a transparent electrode.

The first electrode 312 may include a reflective layer formed of one selected from the group consisting of Ag, Mg, Al, Pt, Pd, Au, Ni, Nd, Ir, Cr and combinations thereof, and a transparent layer formed of ITO, IZO, ZnO or $In_2O_3$. The second electrode 314 may be formed of a transparent conductive material such as ITO, IZO, ZnO, or $In_2O_3$.

The organic light-emitting layer 313 may be formed of a low molecular weight organic material or a high molecular weight organic material. When a low molecular weight organic film is included, the organic light-emitting layer 313 may have a single or multi-layer structure including at least one selected from the group consisting of a hole injection layer (HIL) (not shown), a hole transport layer (HTL) (not shown), an electron transport layer (ETL) (not shown), and an electron injection layer (EIL) (not shown). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

When a high-molecular weight organic layer is included, the organic light-emitting layer 313 may further include a HTL that is disposed in a direction from the organic light-emitting layer 313 towards an anode. In this case, the HTL may be formed of poly(ethylenedioxythiophene) (PEDOT), and the EML may be formed of polyphenylenevinylenes (PPVs) or polyfluorenes.

The image display 3 including the first organic light-emitting portion 316 may be classified into a passive matrix (PM) type and an active matrix (AM) type. In FIGS. 4 and 5, an example of an AM type image display is illustrated. Although not illustrated in FIGS. 4 and 5 in detail, the image display 3 may include at least one thin film transistor (TFT) disposed below the first electrode 321 of each pixel. A TFT electrically connected to the first electrode 321 is a driving TFT, and applies a signal of the first image I1 to each pixel.

A pixel definition layer 315 defines each pixel of the AM type image display 3. Each pixel includes a combination of red, green and blue light-emitting layers so as to realize various colors.

The first image display portion D11 of the first display panel 310 includes the first organic light-emitting portion 316 emitting the first image I1. On the other hand, the second image display portion D12 of the first display panel 310 does not include a separate organic light-emitting portion. Thus, while the second image I2 emitted from the second display panel 320 is not shifted to the first display panel 310, the second image display portion D12 of the first display panel 310 is maintained as a dead space, i.e., a non-emissive portion, of the first display panel 310.

The sealing member 319 including a plurality of thin films is stacked on the first image display portion D11 and the second image display portion D12 of the first display panel 310.

Since the organic light-emitting layer 313 constituting the first organic light-emitting portion 316 of the image display 3 is generally vulnerable to moisture or oxygen, the sealing member 319 is used in order to prevent external moisture and oxygen from penetrating into the organic light-emitting layer 313.

If a sealing substrate formed of transparent glass is used as the sealing member 319, a sealant (not shown) for sealing a space between the sealing substrate and the substrate 311 needs to be formed between the substrate 311 and the sealing substrate. In this case, due to the sealing substrate and the sealant formed on a dead space, i.e., a non-emissive portion, of the image display 3, it is difficult to display the second image I2.

However, the image display 3 includes the sealing member 319 that completely covers the first image display portion D11 and the second image display portion D12 of the substrate 311, instead of a sealing substrate including a separate sealant as a sealing member.

In FIGS. 4 and 5, the sealing member 319 is configured by stacking a single inorganic layer 317 and a single organic layer 318, but the present embodiment is not limited thereto. That is, the inorganic layer 317 and the organic layer 318 may be alternately stacked several times, or a plurality of inorganic layers or a plurality of organic layers may be stacked.

Since the sealing member 319 is transparent, and is stacked on the substrate 311 without any sealant, the second image I2 emitted from the second display panel 320 may be displayed.

The second display panel 320 is substantially vertically spaced apart from the first display panel 310, and is disposed inside the image display 3.

The second display panel 320 includes the second image display portion D22 disposed on a substrate 321 and displaying the second image I2, and a sealing member 329 including a plurality of thin films and disposed on the second image display portion D22.

The second image I2 is emitted from a second organic light-emitting portion 326 of the second display panel 320.

The second organic light-emitting portion 326 includes an organic light-emitting layer interposed between a first electrode and a second electrode, like the first organic light-emitting portion 316.

The image shift unit 330 is disposed between the first display panel 310 and the second display panel 320. The image shift unit 330 shifts the second image I2 displayed on the second display panel 320 to the second image display portion D12 of the first display panel 310 according to a one to one correspondence.

The image shift unit 330 includes a first reflective surface 331 for reflecting the second image I2 emitted from the second organic light-emitting portion 326 of the second display panel 320, and a second reflective surface 332 that is disposed substantially parallel to the first reflective surface 331, and reflects the second image I2 reflected on the first reflective surface 331 to the second image display portion D12 of the first display panel 310, like in the image shift unit 130 of the image display 1.

In FIGS. 4 and 5, the image display 3 is an organic light-emitting display in which the image shift unit 330 is interposed between the first display panel 310 and the second display panel 320, but the present embodiment is not limited thereto. That is, the image shift unit 330 may be disposed on rear surfaces of the first display panel 310 and the second display panel 320, like in the image display 2. In one embodiment, a display surface of the second display panel 320 on which the second image I2 is displayed faces an opposite side of the first display panel 310. In this embodiment, since the image shift unit 330 is disposed on a rear surface of the second display panel 320, the image shift unit 330 may shift the second image I2 emitted from the second display panel 320 to the second image display portion D12 of the first display panel 310 according to a one to one correspondence by reflecting the second image I2.

Since the image display 3 includes the sealing member 319 formed by stacking transparent thin films, instead of a sealing substrate that is completely adhered to the first image display portion D11 and the second image display portion D12 of the first display panel 310 by using a sealant, the second image I2 emitted from the second display panel 320 is displayed on the second image display portion D12 of the first display panel 310. Thus, the second image I2 is displayed on the second image display portion D12 of the first display panel 310, which is a dead space, i.e., as a non-emissive portion, thereby substantially removing the dead space.

According to at leas one of the disclosed embodiments, a second image emitted from a second display panel is displayed on a second image display portion of a first display panel, which is a dead space, i.e., a non-emissive portion, thereby substantially removing the dead space.

While the disclosed embodiments have been particularly shown and described with reference to the accompanying drawings, it will be understood by those of ordinary skill in the art that various changes in form and details may be made therein without departing from the scope of the following claims.

What is claimed is:

1. An image display comprising:
   a first display panel comprising i) a first image display portion configured to display a first image and ii) a light transmissive portion formed outside the first image display portion and configured to display a second image;
   a second display panel spaced apart from the first display panel and configured to generate the second image; and
   an image shift unit configured to shift the generated second image toward the light transmissive portion of the first display panel so that the shifted second image is projected through the light transmissive portion, wherein the image shift unit comprises:
   a first reflective portion configured to first reflect the generated second image; and
   a second reflective portion formed substantially parallel to the first reflective portion, and configured to reflect the first reflected generated second image toward the light transmissive portion, where the first and second reflective portions are respectively formed on opposing surfaces of a prism.

2. The image display of claim 1, wherein the first image display portion comprises a first image light-emitting portion configured to emit the first image, and
   wherein the second display panel comprises a second image emitting portion configured to emit the second image.

3. The image display of claim 1, wherein the light transmissive portion is formed on a non-emissive portion of the first display panel.

4. The image display of claim 1, wherein the first image display portion includes a self-emissive light emitting layer, and wherein the light transmissive portion does not include a self-emissive light emitting layer.

5. The image display of claim 1, wherein the image shift unit is further configured to shift the generated second image toward the light transmissive portion according to a one to one image correspondence.

6. The image display of claim 1, wherein the image shift unit is formed between the first display panel and the second display panel.

7. The image display of claim 1, wherein the second display panel is formed between the first display panel and the image shift unit.

8. The image display of claim 7, wherein the image shift unit comprises:
a first reflective portion configured to first reflect the generated second image; and
a second reflective portion formed to be substantially symmetrical with the first reflective portion, and configured to reflect the first reflected second image toward the light transmissive portion.

9. The image display of claim 8, wherein the first and second reflective portions are respectively formed on a first reflective mirror and a second reflective mirror that are spaced apart from each other.

10. The image display of claim 1, wherein the light transmissive portion abuts the first image display portion.

11. The image display of claim 1, wherein the light transmissive portion is configured to transmit the second image substantially consecutively to the first image displayed on the first image display portion.

12. The image display of claim 1, wherein the second display panel is substantially vertically arranged with respect to the first display panel.

13. An organic light-emitting display comprising:
a first organic light-emitting display panel comprising: i) a first image display portion disposed on a substrate and configured to display a first image emitted from a first organic light-emitting portion, ii) a light transmissive portion substantially surrounding the first image display portion and configured to display a second image and iii) a sealing member formed on the first image display portion and the light transmissive portion;
a second organic light-emitting display panel that is spaced apart from the first display panel, and comprises a second organic light-emitting portion configured to emit the second image; and
an image transfer unit configured to transfer the emitted second image toward the light transmissive portion of the first organic light-emitting display panel so that the transferred second image is projected through the light transmissive portion, wherein the image transfer unit comprises:
a first reflective portion configured to first reflect the emitted second image; and
a second reflective portion formed substantially parallel to the first reflective portion, and configured to reflect the first reflected emitted second image toward the light transmissive portion, where the first and second reflective portions are respectively formed on opposing surfaces of a prism.

14. The organic light-emitting display of claim 13, wherein the sealing member comprises at least one organic layer and at least one inorganic layer which are alternately formed.

15. The organic light-emitting display of claim 13, wherein the sealing member is transparent.

16. The organic light-emitting display of claim 13, wherein the first image display portion of the first organic light-emitting display panel comprises a first image driver configured to apply an image signal to the first organic light-emitting portion, wherein the light transmissive portion of the first organic light-emitting display panel does not comprise an image driver, and wherein the second organic light-emitting display panel comprises a second image driver configured to apply an image signal to the second organic light-emitting portion.

17. The organic light-emitting display of claim 13, wherein the second organic light-emitting display panel is substantially vertically arranged with respect to the first organic light-emitting display panel.

18. The organic light-emitting display of claim 13, wherein the image transfer unit is further configured to transfer the emitted second image toward the light transmissive portion according to one-to-one image correspondence.

19. The organic light-emitting display of claim 13, wherein the image transfer unit is formed between the first organic light-emitting display panel and the second organic light-emitting display panel.

20. The organic light-emitting display of claim 13, wherein the second organic light-emitting display panel is formed between the first organic light-emitting display panel and the image transfer unit.

21. An organic light-emitting display comprising:
a first organic light-emitting display panel comprising: i) a self-emissive region and ii) a non-self-emissive region;
a second organic light-emitting display panel spaced apart from the first display panel and configured to emit an image; and
an image transfer unit configured to transfer the emitted image toward the non-light emitting region of the first organic light-emitting display panel so that the transferred image is projected through the non-self-emissive region, wherein the image transfer unit comprises:
a first reflective portion configured to first reflect the emitted image; and
a second reflective portion formed substantially parallel to the first reflective portion, and configured to reflect the first reflected emitted image toward the light transmissive portion, where the first and second reflective portions are respectively formed on opposing surfaces of a prism.

* * * * *